(12) United States Patent
Xu (10) Patent No.: US 11,329,112 B2
(45) Date of Patent: May 10, 2022

(54) DISPLAY PANEL AND MANUFACTURING METHOD OF DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventor: Ming Xu, Shenzhen (CN)

( * ) Notice: Subject to any disclaimer, the term of this patent is extended or adjusted under 35 U.S.C. 154(b) by 291 days.

(21) Appl. No.: 16/618,371

(22) PCT Filed: Nov. 5, 2019

(86) PCT No.: PCT/CN2019/115517
§ 371 (c)(1),
(2) Date: Dec. 1, 2019

(87) PCT Pub. No.: WO2021/051493
PCT Pub. Date: Mar. 25, 2021

(65) Prior Publication Data
US 2021/0367010 A1 Nov. 25, 2021

(30) Foreign Application Priority Data
Sep. 16, 2019 (CN) .......................... 201910868781.9

(51) Int. Cl.
*H01L 27/32* (2006.01)
*H01L 51/50* (2006.01)
*H01L 51/52* (2006.01)
*H01L 51/56* (2006.01)

(52) U.S. Cl.
CPC ........ *H01L 27/3246* (2013.01); *H01L 27/322* (2013.01); *H01L 51/502* (2013.01); *H01L 51/5237* (2013.01); *H01L 51/56* (2013.01)

(58) Field of Classification Search
None
See application file for complete search history.

(56) References Cited

U.S. PATENT DOCUMENTS

| 2018/0138411 A1 | 5/2018 | Hung et al. |
| 2018/0166519 A1 | 6/2018 | Kim et al. |

FOREIGN PATENT DOCUMENTS

| CN | 103325663 A |   | 9/2013 |
| CN | 104733505 A |   | 6/2015 |
| CN | 109860243 A |   | 6/2019 |
| CN | 110176545 A | * | 8/2019 |

* cited by examiner

*Primary Examiner* — Michelle Mandala (57) ABSTRACT

A display panel and a manufacturing method of a display panel are provided. The display panel includes an, a plurality of pixel definition portions, and a plurality of light-emitting portions. The plurality of pixel definition portions are disposed on the array substrate and separated apart from each other. A quantum dot material is provided on a side of one of the pixel definition portions, and the side of the pixel definition portions faces an adjacent pixel definition portion. Each of the light-emitting portions is disposed between two adjacent pixel definition portions, the light-emitting portions are configured to emit light, and the quantum dot material on the side of the pixel definition portion is illuminated under excitation of the light.

10 Claims, 5 Drawing Sheets

DISPLAY PANEL AND MANUFACTURING METHOD OF DISPLAY PANEL

FIELD OF DISCLOSURE

The present disclosure relates to the field of display technologies, and in particular to a display panel and a manufacturing method of a display panel.

BACKGROUND

With a development of display panel technologies, quantum dot organic light-emitting diodes (QD-OLEDs) have become more and more widely used because they have advantages of wide color gamut, high contrast, and vivid color.

The QD-OLED adopts a thin film stack structure, and specifically includes two electrodes and stacked organic layers disposed between the two electrodes. A blue organic light-emitting diode serves as a light source, and a quantum dot film is formed above the blue organic light-emitting diode. Under excitation of blue light emitted by the blue organic light-emitting diode, light of different colors is formed. However, the light transmitted toward both sides of a display panel is not effectively utilized, which reduces a luminous efficiency.

SUMMARY OF DISCLOSURE

An object of the present disclosure is to provide a display panel and a manufacturing method of a display panel, which improves a luminous intensity of the display panel.

An embodiment of the present disclosure provides a display panel, including an array substrate, a plurality of pixel definition portions, and a plurality of light-emitting portions.

The plurality of pixel definition portions are disposed on the array substrate and separated apart from each other. A quantum dot material is provided on a side of one of the pixel definition portions, and the side of the pixel definition portions faces an adjacent pixel definition portion.

Each of the light-emitting portions is disposed between two adjacent pixel definition portions, the light-emitting portions are configured to emit light, and the quantum dot material on the side of the pixel definition portion is illuminated under excitation of the light.

In one embodiment, material of each pixel definition portion includes a host material and a doping material, and the doping material includes the quantum dot material.

In one embodiment, a doping concentration of the quantum dot material in the pixel definition portion is not greater than 5%.

In one embodiment, a coating layer is disposed on the side of the pixel definition portion, and material of the coating layer includes the quantum dot material.

In one embodiment, the quantum dot material includes a first quantum dot material and/or a second quantum dot material. The first quantum dot material is a yellow color quantum dot material, and the second quantum dot material include a green color quantum dot material and a red color quantum dot material.

In one embodiment, opposite sides of two adjacent pixel definition portions have the same quantum dot material, or have different quantum dot materials.

In one embodiment, the light-emitting portions are made of a blue light-emitting material.

In one embodiment, the display panel further includes a first optical layer. The first optical layer includes a red light conversion layer and a green light conversion layer.

The red light conversion layer is correspondingly disposed opposite to one of the light-emitting portions.

The green light conversion layer is correspondingly disposed opposite to another one of the light-emitting portions.

In one embodiment, the display panel further includes a second optical layer. The second optical layer includes a red color filter layer, a green color filter layer, and a blue color filter layer.

The red color filter layer is disposed on the red light conversion layer.

The green color filter layer is disposed on the green light conversion layer.

The blue color filter layer is correspondingly disposed opposite to one of the light-emitting portions.

In one embodiment, the display panel further includes a cathode layer and a thin film encapsulation layer. The cathode layer is disposed on the light-emitting portions.

The thin film encapsulation layer is disposed between the cathode layer and the first optical layer or the second optical layer corresponding to the cathode layer.

Another embodiment of the present disclosure also provides a manufacturing method of a display panel, including the following.

providing an array substrate;

coating the array substrate with a photoresist, where the photoresist is doped with a quantum dot material;

processing the photoresist to form a plurality of pixel definition portions disposed on the array substrate and separated apart from each other such that sides of the pixel definition portions are doped with the quantum dot material, and one of the sides of one of the pixel definition portions is a side facing an adjacent pixel definition portion; and forming a light-emitting portion between two adjacent pixel definition portions for emitting light, where the quantum dot material on the sides of the pixel definition portions is illuminated under excitation of the light.

Furthermore, another embodiment of the present disclosure also provides a manufacturing method of a display panel, including the following.

providing an array substrate;

forming a plurality of pixel definition portions disposed on the array substrate and separated apart from each other;

providing a coating layer on a side of one of the pixel definition portions opposite to an adjacent pixel definition portion, where the coating layer is made of a quantum dot material; and forming a light-emitting portion between two adjacent pixel definition portions for emitting light, where the quantum dot material on the side of the pixel definition portion is illuminated under excitation of the light.

In the display panel and the manufacturing method of the display panel of the embodiments of the present disclosure, the sides of the pixel definition portions have the quantum dot material, and the quantum dot luminescent material can emit light under the excitation of light emitted from a luminous layer, thereby increasing the luminous intensity of the display panel.

For a better understanding of the aforementioned content of the present invention, preferable embodiments are illustrated in accordance with the attached drawings for further explanation.

BRIEF DESCRIPTION OF DRAWINGS

FIG. 4 is schematic diagrams of the display panel illustrating the manufacturing method according to the embodiment of the present disclosure.

DETAILED DESCRIPTION

The following embodiments are referring to the accompanying drawings for exemplifying specific implementable embodiments of the present disclosure. Furthermore, directional terms described by the present disclosure, such as upper, lower, front, back, left, right, inner, outer, side and etc., are only directions by referring to the accompanying drawings, and thus the used directional terms are used to describe and understand the present disclosure, but the present disclosure is not limited thereto.

In the drawings, structurally similar elements are denoted by the same reference numerals.

Reference herein to "one embodiment" means that a particular feature, structure, or characteristic described in connection with the embodiments is included in at least one embodiment of the present disclosure. The phrase appearing in various places in the specification does not necessarily refer to the same embodiment, nor does it refer to an independent or alternative embodiment that is mutually exclusive with other embodiments. It is expressly and implicitly understood by those skilled in the art that an embodiment described herein may be combined with other embodiments.

Figure 1:
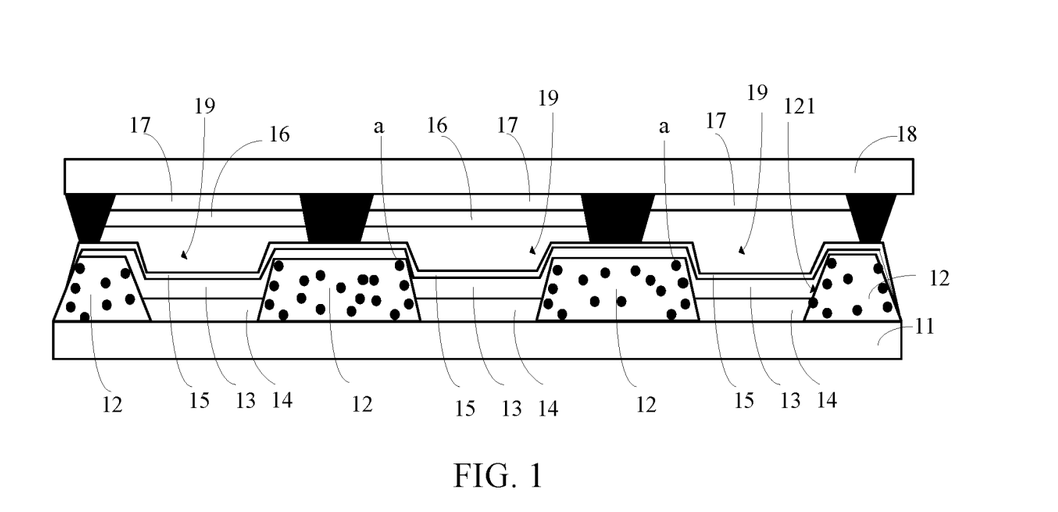
FIG. 1 is a schematic diagram of a display panel according to an embodiment of the present disclosure.

FIG. 1 is a schematic diagram of a display panel according to an embodiment of the present disclosure. As shown in FIG. 1, a display panel 1 includes an array substrate 11, a plurality of pixel definition portions 12, and a plurality of light-emitting portions 13.

The array substrate 11 may include a substrate and a thin film transistor layer. The substrate may be a flexible substrate made of a flexible material selected from the group consisting of polyimide, polycarbonate, polyether sulfone, polyethylene terephthalate, polyethylene naphthalate, and polyarylate.

The plurality of pixel definition portions 12 are disposed on the array substrate 11 and separated apart from each other. A quantum dot material is provided on a side 121 of one of the pixel definition portions 12, and the side 121 of the pixel definition portions 12 faces an adjacent pixel definition portion 12.

In one embodiment, material of each the pixel definition portion 12 includes a host material and a doping material. The host material includes a photoresist material, and the doping material includes the quantum dot material. That is, as shown in FIG. 1, the quantum dot material a is distributed in the pixel definition portions 12 such that the side 121 of the pixel definition portion 12 has the quantum dot material a. In one embodiment, a doping concentration of the quantum dot material in the pixel definition portion 12 is not greater than 5%, which can avoid a conversion efficiency of the luminescence of the quantum dot material being too low due to a low concentration, and can avoid an excessive concentration affecting a formation of the pixel definition portions 12.

Figure 2:
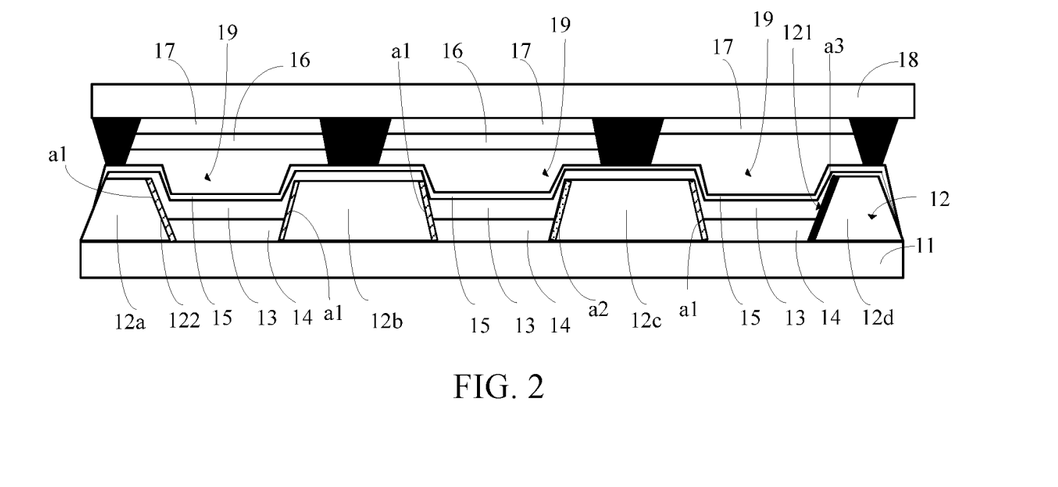
FIG. 2 is a schematic diagram of another display panel according to an embodiment of the present disclosure.

In one embodiment, as shown in FIG. 2, a side 121 of a pixel definition portion 12 is provided with a coating layer 122. Material of the coating layer 122 includes a quantum dot material. Also, the quantum dot material is only distributed on the side 121 of the pixel definition portion 12, which can reduce the amount of quantum dot material and reduce costs.

The quantum dot material includes a first quantum dot material and/or a second quantum dot material. The first quantum dot material is a yellow color quantum dot material, and the second quantum dot material includes a green color quantum dot material and a red color quantum dot material.

It should be noted that opposite sides 121 of the two adjacent pixel definition portions 12 have the same quantum dot material or have different quantum dot materials. As shown in FIG. 2, there are four pixel definition portions 12, from left to right, including a first pixel definition portion 12a, a second pixel definition portion 12b, a third pixel definition portion 12c, and a fourth pixel definition portion 12d. The sides opposite to each other of the first pixel definition portion 12a and the second pixel definition portion 12b have yellow color quantum dot material a1, that is, the opposite sides of the two adjacent pixel definition portions have the same quantum dot material. A side of the second pixel definition portion 12c facing the third pixel definition portion 12c has a yellow color quantum dot material a1, and a side of the third pixel definition portion 12c facing the second pixel definition portion 12b has a red color quantum dot material a2, that is, the opposite sides of the two adjacent pixel definition portions have different quantum dot materials. Similarly, a side of the third pixel definition portion 12c facing the fourth pixel definition portion 12d has a yellow color quantum dot material a1, and a side of the fourth pixel definition portion 12d facing the third pixel definition portion 12c has a green color quantum dot material a3, that is, the opposite sides of the two adjacent pixel definition portions have different quantum dot materials.

Each of the light-emitting portions 13 is disposed between two adjacent pixel definition portions 12. The light-emitting portions 13 are configured to emit light, and the quantum dot material on the sides 121 of the pixel definition portions 12 is illuminated under excitation of the light, thereby increasing a luminous intensity of the display panel 1.

Material of the light-emitting portions 13 includes a blue light-emitting material. The blue light-emitting material may be a blue color quantum dot material or a blue organic light-emitting material.

As shown in FIG. 1 or FIG. 2, the display panel 1 further includes an anode layer 14 and a cathode layer 15. The anode layer 14 is disposed on the array substrate 11, the light-emitting portions 13 are disposed on the anode layer 14, and the cathode layer 15 is disposed on the light-emitting portions 13. Material of the cathode layer 15 may include one or more of metals such as lithium, calcium, lithium, aluminum, and silver. Material of the anode layer 14 may be a metal oxide such as indium tin oxide.

Specifically, the blue light-emitting material in the light-emitting portion 13 emits blue light under action of the anode layer 14 and the cathode layer 15. The quantum dot material located on the sides 121 of the pixel definition portions 12 emits light of a corresponding color under excitation of the blue light. For example, when the quantum dot material located on the sides 121 of the pixel definition portions 12 is the red quantum dot material, red light is emitted under the excitation of the blue light.

In an embodiment, the display panel 1 further includes a first optical layer 16. The first optical layer 16 includes a red light conversion layer and a green light conversion layer. The red light conversion layer is correspondingly disposed opposite to the light-emitting portions 13. The red light conversion layer is configured to convert light of other colors into red light. The green light conversion layer is correspondingly disposed opposite to the light-emitting portions 13. The green light conversion layer is configured to convert light of other colors into green light.

In an embodiment, the display panel 1 further includes a second optical layer 17, and the second optical layer 17 includes a red color filter layer, a blue color filter layer, and a green color filter layer. The red color filter layer is disposed on the red light conversion layer. The red color filter layer is configured to filter the red light in the light. The green color filter layer is disposed on the green light conversion layer. The green color filter layer is configured to filter the green light in the light. The blue color filter layer is correspondingly disposed opposite to the light-emitting portions 13. The blue color filter layer is configured to filter the blue light in the light.

The display panel 1 further includes a cover 18. The first optical layer 16 and the second optical layer 17 described above are disposed on the cover 18.

In an embodiment, the display panel 1 further includes a thin film encapsulation layer 19. The thin film encapsulation layer 19 is disposed between the cathode layer 15 and the first optical layer 16 or the second optical layer 17 opposite to the cathode layer 15. The thin film encapsulation layer 19 can prevent permeation of external moisture and oxygen.

Figure 3:
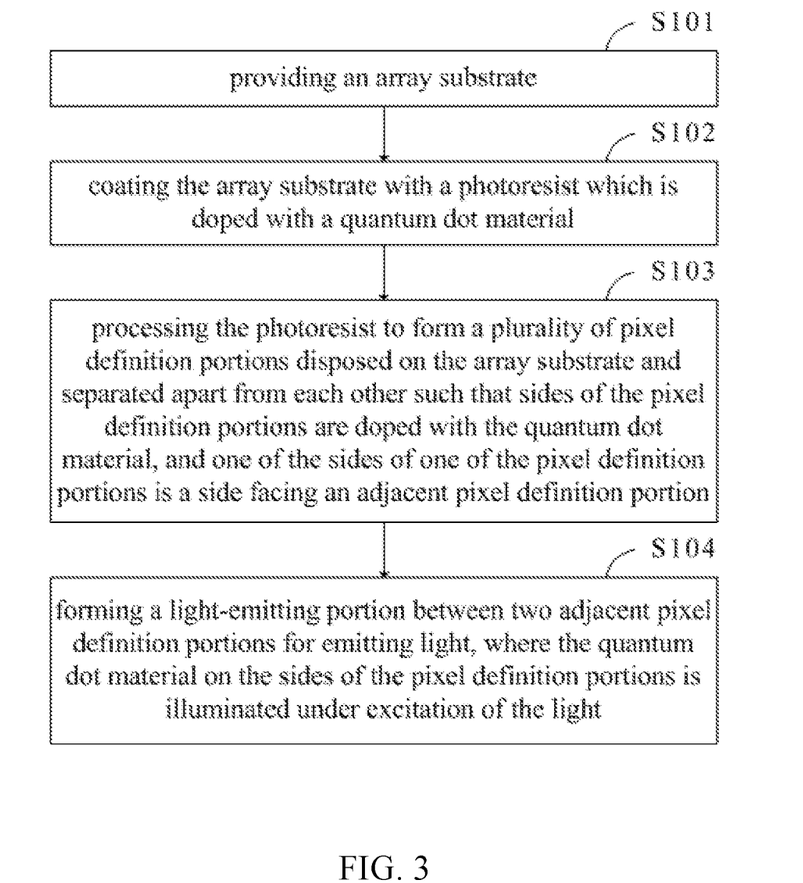
FIG. 3 is a flowchart of a manufacturing method of a display panel according to an embodiment of the present disclosure.

An embodiment of the present disclosure also provides a manufacturing method of a display panel. FIG. 3 is a flowchart of a manufacturing method of a display panel according to an embodiment of the present disclosure. The manufacturing method of the display panel includes the following.

In a step S101, an array substrate is provided.

The array substrate 11 may include a substrate and a thin film transistor layer. The substrate may be a flexible substrate made of a flexible material selected from the group consisting of polyimide, polycarbonate, polyether sulfone, polyethylene terephthalate, polyethylene naphthalate, and polyarylate.

In a step S102, the array substrate is coated with a photoresist. The photoresist is doped with a quantum dot material.

Figure 4:
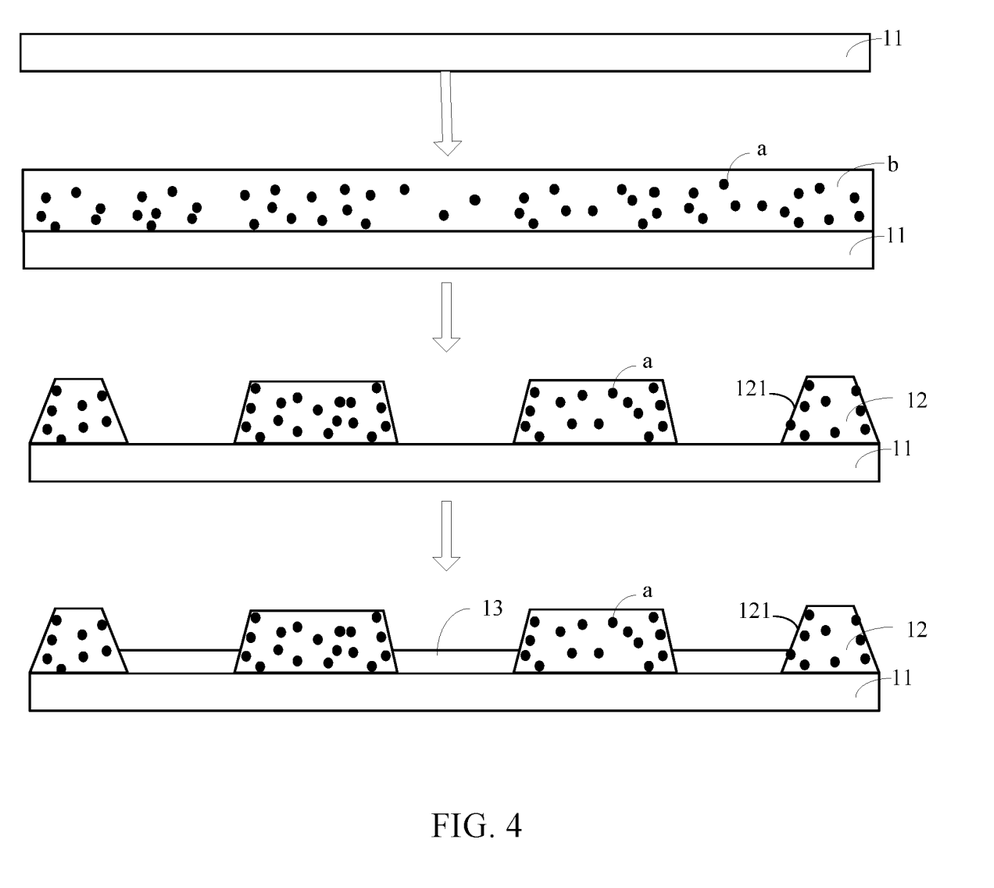
FIG. 4 is schematic diagrams of a display panel illustrating a manufacturing method according to an embodiment of the present disclosure.

As shown in FIG. 4, the array substrate 1 is coated with a photoresist b. The photoresist b is doped with a quantum dot material.

The quantum dot material includes a first quantum dot material and/or a second quantum dot material. The first quantum dot material is a yellow color quantum dot material, and the second quantum dot material includes a green color quantum dot material and a red color quantum dot material.

In a step S103, the photoresist is processed to form a plurality of pixel definition portions disposed on the array substrate and separated apart from each other such that sides of the pixel definition portions are doped with the quantum dot material, and one of the sides of one of the pixel definition portions is a side facing an adjacent pixel definition portion.

After the photoresist is exposed and developed, the pixel definition portions 12 as shown in FIG. 4 are formed. The sides 121 of the pixel definition portions 12 have the quantum dot material. One of the sides 121 of one of the pixel definition portions 12 is a side facing an adjacent pixel definition portion 12.

Material of each the pixel definition portion 12 includes a host material and a doping material. The host material includes a photoresist material, and the doping material includes the quantum dot material. In one embodiment, a doping concentration of the quantum dot material in the pixel definition portion 12 is not greater than 5%, which can avoid a conversion efficiency of the luminescence of the quantum dot material being too low due to a low concentration, and can avoid an excessive concentration affecting a formation of the pixel definition portions 12.

In a step S104, a light-emitting portion is formed between two adjacent pixel definition portions for emitting light. The quantum dot material on the sides of the pixel definition portions is illuminated under excitation of the light.

Each of the light-emitting portions 13 is disposed between two adjacent pixel definition portions 12. The light-emitting portions 13 are configured to emit light, and the quantum dot material on the sides 121 of the pixel definition portions 12 is illuminated under excitation of the light, thereby increasing a luminous intensity of the display panel 1.

Material of the light-emitting portions 13 includes a blue light-emitting material. The blue light-emitting material may be a blue color quantum dot material or a blue organic light-emitting material.

Specifically, the blue light-emitting material in the light-emitting portion 13 emits blue light. The quantum dot material located on the sides 121 of the pixel definition portions 12 emits light of a corresponding color under excitation of the blue light. For example, when the quantum dot material located on the sides 121 of the pixel definition portions 12 is a red quantum dot material, red light is emitted under the excitation of the blue light.

Figure 5:
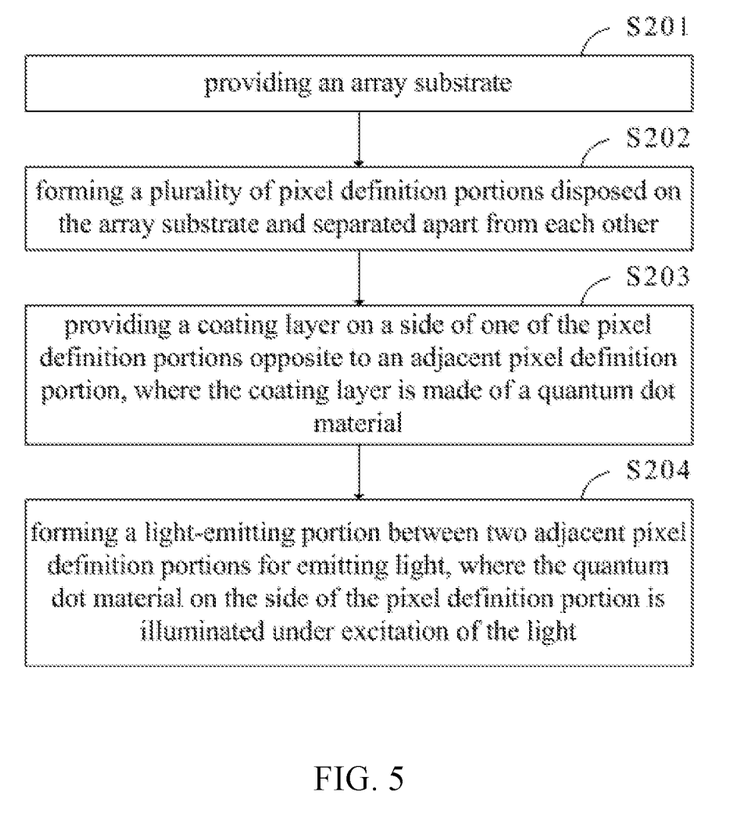
FIG. 5 is a flowchart of a manufacturing method of another display panel according to an embodiment of the present disclosure.

Furthermore, an embodiment of the present disclosure also provides a manufacturing method of a display panel. FIG. 5 is a flowchart of a manufacturing method of a display panel according to an embodiment of the present disclosure. The manufacturing method of the display panel includes the following.

In a step S201, an array substrate is provided.

The array substrate 11 may include a substrate and a thin film transistor layer. The substrate may be a flexible substrate made of a flexible material selected from the group consisting of polyimide, polycarbonate, polyether sulfone, polyethylene terephthalate, polyethylene naphthalate, and polyarylate.

In a step S202, a plurality of pixel definition portions disposed on the array substrate and separated apart from each other are formed.

Material of the pixel definition portions 12 includes a photoresist material.

In a step S203, a coating layer is provided on a side of one of the pixel definition portions opposite to an adjacent pixel definition portion. The coating layer is made of a quantum dot material.

Figure 6:
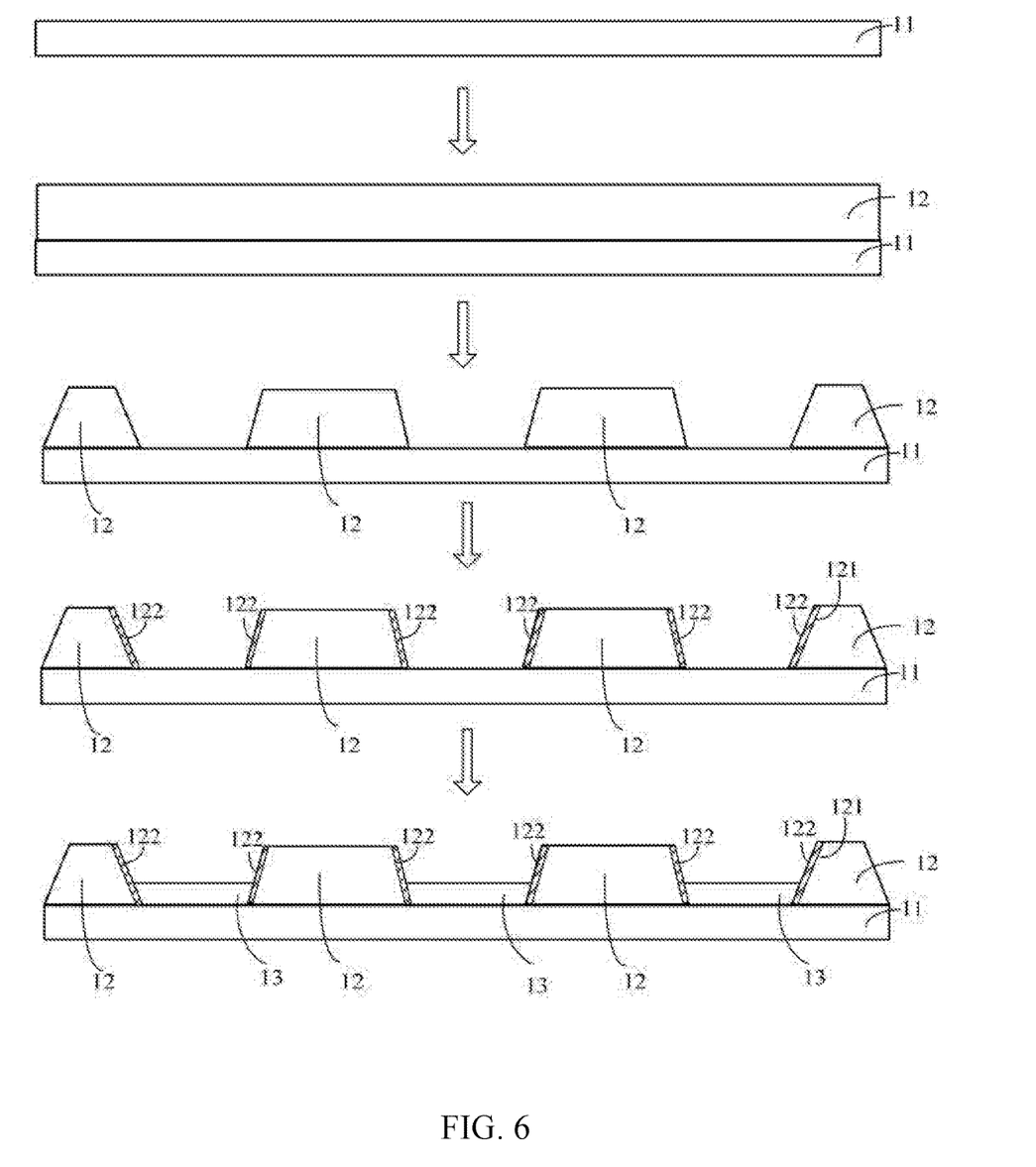
FIG. 6 is schematic diagrams of the display panel illustrating the manufacturing method according to the embodiment of the present disclosure.

As shown in FIG. 6, a side 121 of a pixel definition portion 12 is provided with a coating layer 122. Material of the coating layer 122 includes a quantum dot material. Also, the quantum dot material is only distributed on the side 121 of the pixel definition portion 12, which can reduce the amount of quantum dot material and reduce costs.

The quantum dot material includes a first quantum dot material and/or a second quantum dot material. The first quantum dot material is a yellow color quantum dot material, and the second quantum dot material includes a green color quantum dot material and a red color quantum dot material.

It should be noted that opposite sides 121 of the two adjacent pixel definition portions 12 have the same quantum dot material or have different quantum dot materials. As shown in FIG. 2, there are four pixel definition portions 12, from left to right, including a first pixel definition portion 12a, a second pixel definition portion 12b, a third pixel definition portion 12c, and a fourth pixel definition portion 12d. The sides opposite to each other of the first pixel definition portion 12a and the second pixel definition portion 12b have yellow color quantum dot material a1, that is, the opposite sides of the two adjacent pixel definition portions have the same quantum dot material. A side of the second pixel definition portion 12c facing the third pixel definition portion 12c has a yellow color quantum dot material a1, and a side of the third pixel definition portion 12c facing the second pixel definition portion 12b has a red color quantum dot material a2, that is, the opposite sides of the two adjacent pixel definition portions have different quantum dot materials. Similarly, a side of the third pixel definition portion 12c facing the fourth pixel definition portion 12d has a yellow color quantum dot material a1, and a side of the fourth pixel definition portion 12d facing the third pixel definition portion 12c has a green color quantum dot material a3, that is, the opposite sides of the two adjacent pixel definition portions have different quantum dot materials.

In a step S204, a light-emitting portion is formed between two adjacent pixel definition portions for emitting light. The quantum dot material on the side of the pixel definition portion is illuminated under excitation of the light.

Each of the light-emitting portions 13 is disposed between two adjacent pixel definition portions 12. The light-emitting portions 13 are configured to emit light, and the quantum dot material on the sides 121 of the pixel definition portions 12 is illuminated under excitation of the light, thereby increasing a luminous intensity of the display panel 1.

Material of the light-emitting portions 13 includes a blue light-emitting material. The blue light-emitting material may be a blue color quantum dot material or a blue organic light-emitting material.

Specifically, the blue light-emitting material in the light-emitting portion 13 emits blue light. The quantum dot material located on the sides 121 of the pixel definition portions 12 emits light of a corresponding color under excitation of the blue light. For example, when the quantum dot material located on the sides 121 of the pixel definition portions 12 is a red quantum dot material, red light is emitted under the excitation of the blue light.

In the display panel and the manufacturing method of the display panel of the embodiments of the present disclosure, the sides of the pixel definition portions have the quantum dot material, and the quantum dot luminescent material can emit light under the excitation of light emitted from a luminous layer, thereby increasing the luminous intensity of the display panel.

Although the present disclosure has been explained by the embodiments shown in the drawings described above, it should be understood to the ordinary skilled person in the art that the disclosure is not limited to the embodiments, but rather various changes or modifications thereof are possible without departing from the spirit of the disclosure. Accordingly, the scope of the disclosure shall be determined only by the appended claims and their equivalents.

What is claimed is:

1. A display panel, comprising:
    an array substrate;
    a plurality of pixel definition portions disposed on the array substrate and separated apart from each other, wherein a quantum dot material is provided on a side of one of the pixel definition portions, and the side of the pixel definition portions faces an adjacent pixel definition portion, wherein the quantum dot material comprises a first quantum dot material and/or a second quantum dot material, and the first quantum dot material is a yellow color quantum dot material, and the second quantum dot material comprise a green color quantum dot material and a red color quantum dot material; and
    a plurality of light-emitting portions, wherein each of the light-emitting portions is disposed between two adjacent pixel definition portions, the light-emitting portions are configured to emit light, and the quantum dot material on the side of the pixel definition portion is illuminated under excitation of the light.

2. The display panel as claimed in claim 1, wherein material of each the pixel definition portion comprises a host material and a doping material, and the doping material comprises the quantum dot material.

3. The display panel as claimed in claim 2, wherein a doping concentration of the quantum dot material in the pixel definition portion is not greater than 5%.

4. The display panel as claimed in claim 1, wherein a coating layer is disposed on the side of the pixel definition portion, and material of the coating layer comprises the quantum dot material.

5. The display panel as claimed in claim 1, wherein opposite sides of two adjacent pixel definition portions have the same quantum dot material, or have different quantum dot materials.

6. The display panel as claimed in claim 1, wherein the light-emitting portions are made of a blue light-emitting material.

7. A display panel, comprising:
    an array substrate;
    a plurality of pixel definition portions disposed on the array substrate and separated apart from each other, wherein a quantum dot material is provided on a side of one of the pixel definition portions, and the side of the pixel definition portions faces an adjacent pixel definition portion;
    a plurality of light-emitting portions, wherein each of the light-emitting portions is disposed between two adjacent pixel definition portions, the light-emitting portions are configured to emit light, and the quantum dot material on the side of the pixel definition portion is illuminated under excitation of the light; and
    a first optical layer, wherein the first optical layer comprises:
        a red light conversion layer correspondingly disposed opposite to one of the light-emitting portions; and
        a green light conversion layer correspondingly disposed opposite to another one of the light-emitting portions.

8. The display panel as claimed in claim 7, further comprising a second optical layer, wherein the second optical layer comprises:
- a red color filter layer disposed on the red light conversion layer;
- a green color filter layer disposed on the green light conversion layer; and
- a blue color filter layer correspondingly disposed opposite to one of the light-emitting portions.

9. The display panel as claimed in claim 8, further comprising a cathode layer and a thin film encapsulation layer, wherein the cathode layer is disposed on the light-emitting portions; and
- wherein the thin film encapsulation layer is disposed between the cathode layer and the first optical layer or the second optical layer corresponding to the cathode layer.

10. A manufacturing method of a display panel, comprising:
- providing an array substrate;
- coating the array substrate with a photoresist, wherein the photoresist is doped with a quantum dot material;
- processing the photoresist to form a plurality of pixel definition portions disposed on the array substrate and separated apart from each other such that sides of the pixel definition portions are doped with the quantum dot material, and one of the sides of one of the pixel definition portions is a side facing an adjacent pixel definition portion; and
- forming a light-emitting portion between two adjacent pixel definition portions for emitting light, wherein the quantum dot material on the sides of the pixel definition portions is illuminated under excitation of the light.

* * * * *